United States Patent
Lee et al.

(10) Patent No.: US 12,412,827 B2
(45) Date of Patent: *Sep. 9, 2025

(54) SEMICONDUCTOR DIE PACKAGE WITH CONDUCTIVE LINE CRACK PREVENTION DESIGN

(71) Applicant: Taiwan Semiconductor Manufacturing Company, Ltd., Hsinchu (TW)

(72) Inventors: Ya-Huei Lee, Zhunan Township, Miaoli County (TW); Shu-Shen Yeh, Taoyuan (TW); Kuo-Ching Hsu, Taipei (TW); Shyue-Ter Leu, Hsinchu (TW); Po-Yao Lin, Zhudong Township, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/513,866

(22) Filed: Nov. 20, 2023

(65) Prior Publication Data
US 2024/0096778 A1     Mar. 21, 2024

Related U.S. Application Data

(63) Continuation of application No. 17/377,620, filed on Jul. 16, 2021, now Pat. No. 11,854,956.

(51) Int. Cl.
*H01L 23/498* (2006.01)
*H01L 23/00* (2006.01)

(52) U.S. Cl.
CPC .. *H01L 23/49838* (2013.01); *H01L 23/49822* (2013.01); *H01L 24/16* (2013.01);
(Continued)

(58) Field of Classification Search
None
See application file for complete search history.

(56) References Cited

U.S. PATENT DOCUMENTS 8,309,435 B2 *  11/2012  Kaltalioglu ........... H01L 23/585
                                                      257/620
8,354,734 B2 *   1/2013  Wang ................... H01L 23/562
                                                      257/E21.523

(Continued)

FOREIGN PATENT DOCUMENTS

TW       200428604 A     12/2004

OTHER PUBLICATIONS

Chinese language office action dated Mar. 25, 2023, issued in application No. TW 111110331.

*Primary Examiner* — Long Pham
(74) *Attorney, Agent, or Firm* — McClure, Qualey & Rodack, LLP (57) ABSTRACT

A semiconductor die package is provided. The semiconductor die package includes a semiconductor die and a package substrate supporting and electrically connected to the semiconductor die. The semiconductor die has a corner. The package substrate includes several conductive lines, and one of the conductive lines under the corner of the semiconductor die includes a first line segment and a second line segment connected to the first line segment. The first line segment is linear and extends in a first direction. The second line segment is non-linear and has a varying extension direction.

20 Claims, 9 Drawing Sheets

(52) U.S. Cl.
CPC ............... *H01L 2224/16227* (2013.01); *H01L 2924/1016* (2013.01); *H01L 2924/20645* (2013.01)

(56) References Cited

U.S. PATENT DOCUMENTS 10,714,426 B2 * 7/2020 Hsieh .................. H01L 21/4857
2011/0244658 A1 10/2011 Kaltalioglu et al.
2022/0361338 A1 * 11/2022 Hsu ..................... H01L 25/0655

* cited by examiner

SEMICONDUCTOR DIE PACKAGE WITH CONDUCTIVE LINE CRACK PREVENTION DESIGN

PRIORITY CLAIM AND CROSS-REFERENCE

This application is a Continuation of U.S. application Ser. No. 17/377,620, filed on Jul. 16, 2021 (now U.S. Pat. No. 11,854,956), the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules (MCM), for example, or in other types of packaging. A package (structure) not only provides protection for semiconductor devices from environmental contaminants, but also provides a connection interface for the semiconductor devices packaged therein.

One smaller type of packaging for semiconductors is a flip chip chip-scale package (FcCSP), in which a semiconductor die is placed upside-down on a substrate and bonded to the substrate using bumps. The substrate has wiring routed to connect the bumps on the die to contact pads on the substrate that have a larger footprint. An array of solder balls is formed on the opposite side of the substrate and is used to electrically connect the packaged die to an end application.

Although existing package structures and methods for fabricating package structures have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g., a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

A semiconductor die package (structure) having a conductive line crack prevention design and the method of forming the same are provided in accordance with various exemplary embodiments of the disclosure. The variations of the embodiments are discussed. Throughout the various views and illustrative embodiments, like reference numbers are used to designate like elements. In accordance with some embodiments, a semiconductor die package utilizes non-linear or curved conductive lines at the predetermined die corner areas within the die shadow to disperse stress, thereby reducing the risk of line crack after thermal processes. Accordingly, the reliability of the semiconductor die package is improved.

Embodiments will be described with respect to a specific context, namely a chip scale package (CSP), particularly flip chip CSP (FcCSP). Other embodiments may also be applied, however, to other packaging techniques, such as flip chip ball grid array (FcBGA) packages and other packaging techniques, such as with an interposer or other active chip in a two and a half dimensional integrated circuit (2.5DIC) structure or a three dimensional IC (3DIC) structure. Although method embodiments may be discussed below as being performed in a particular order, other method embodiments contemplate steps that are performed in any logical order.

Figure 1A:
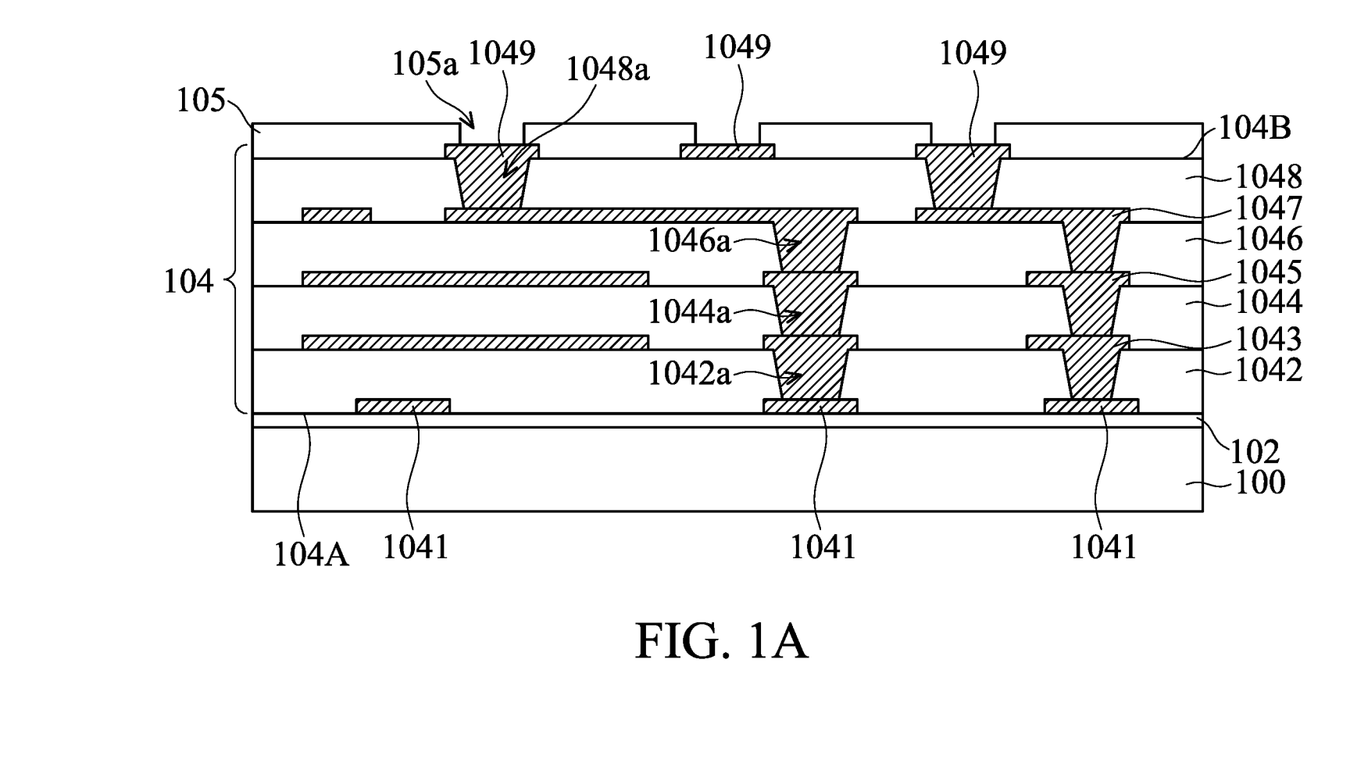
FIGS. 1A-1C are cross-sectional views of various stages of a process for forming a semiconductor die package in accordance with some embodiments.
Figure 1B:
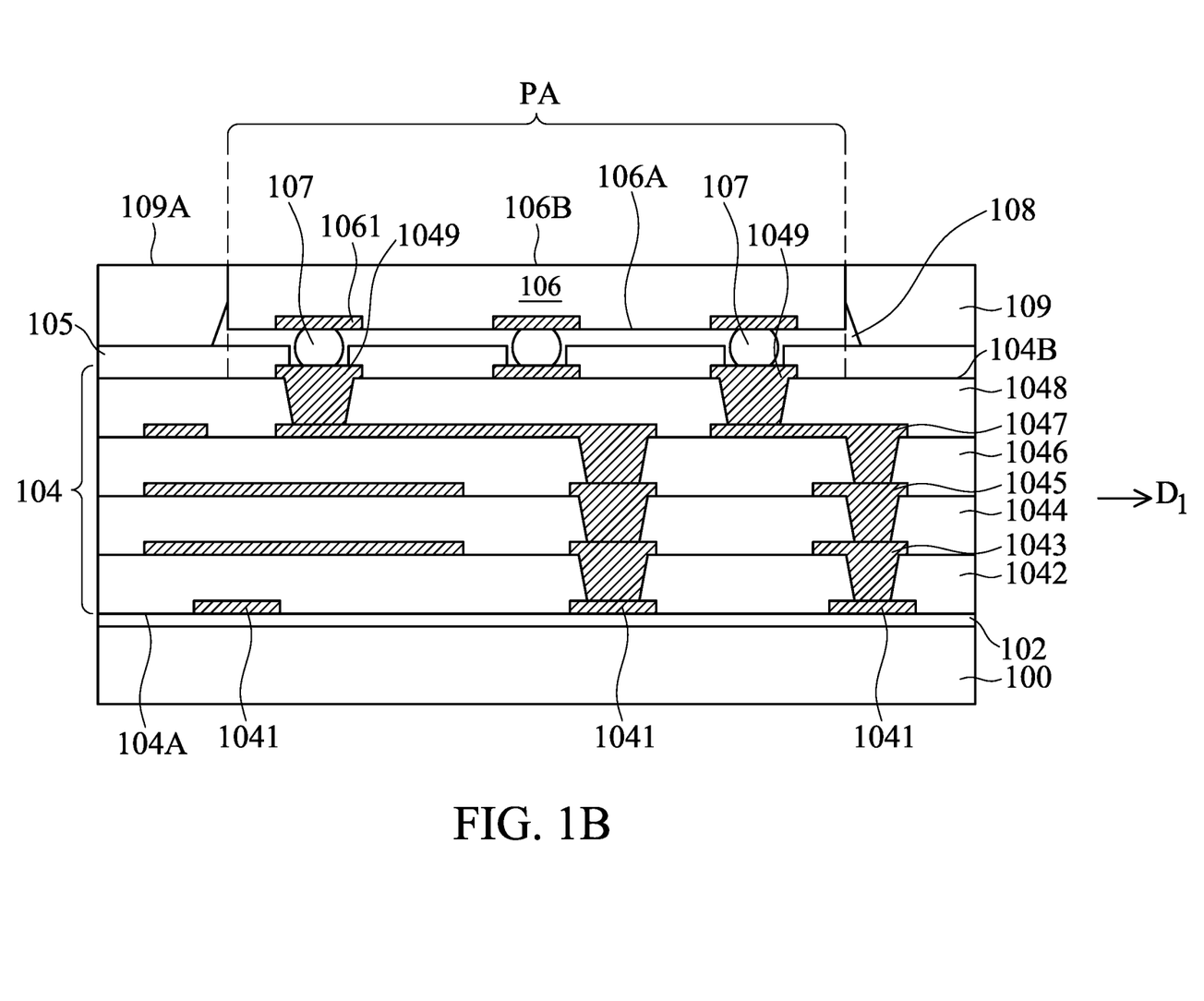
Figure 1C:
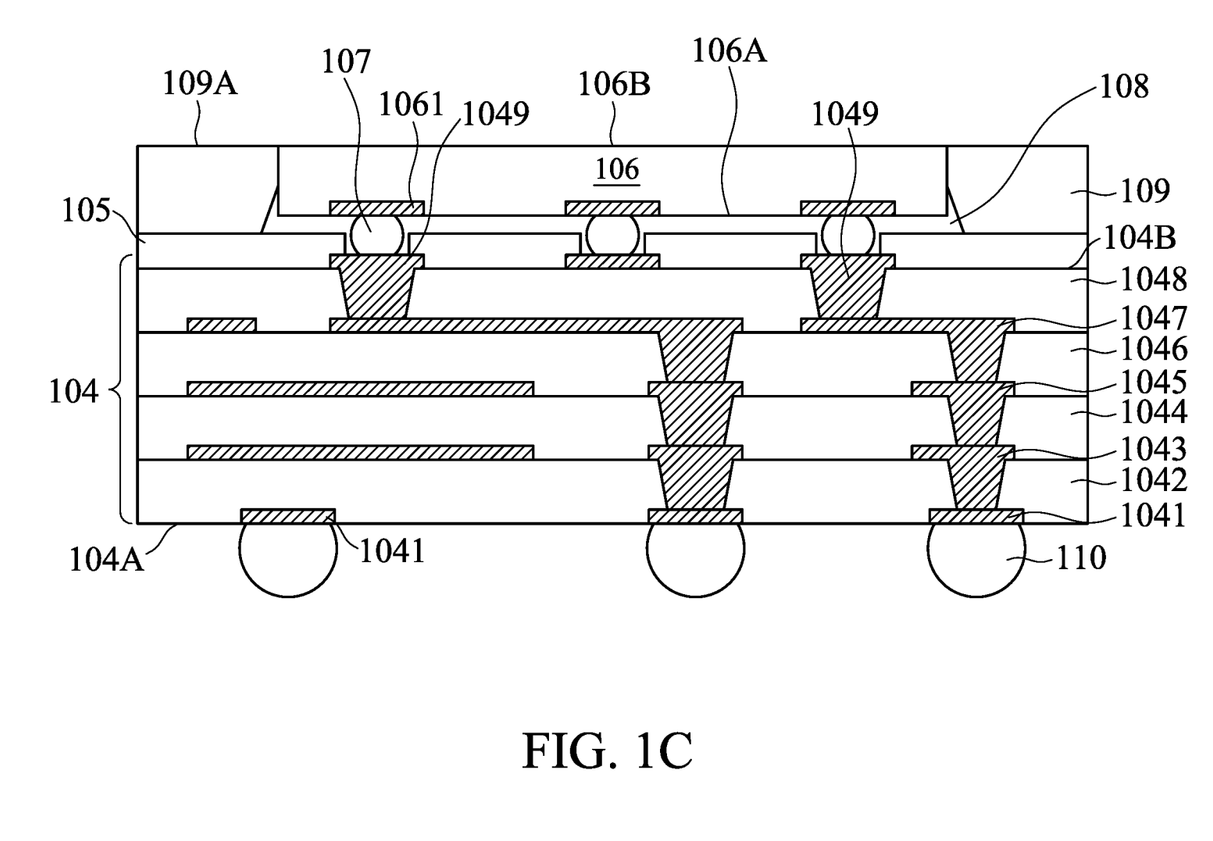

FIGS. 1A-1C illustrate cross-sectional views of intermediate stages in the formation of a semiconductor die package in accordance with some embodiments. As shown in FIG. 1A, a carrier substrate 100 is provided, in accordance with some embodiments. The carrier substrate 100 may be configured to provide temporary mechanical and structural support for the processing of build-up layers or structures during subsequent processing steps. In some embodiments, the carrier substrate 100 is a glass carrier substrate, a ceramic carrier substrate, or the like.

As shown in FIG. 1A, a release layer 102 is formed over the carrier substrate 100, in accordance with some embodiments. The release layer 102 may be formed of a polymer-based material, and may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In some other embodiments, the release layer 102 is an ultra-violet (UV) glue, which loses its adhesive property when exposed to UV lights. The release layer 102 may be dispensed as a liquid and then cured, may be a laminate film laminated onto the carrier substrate 100, or may be the like.

As shown in FIG. 1A, a package substrate 104 is formed on the release layer 102, in accordance with some embodiments. The package substrate 104 has a surface 104A facing the release layer 102, and another surface 104B opposite to the surface 104A. The package substrate 104 may be used for routing and configured to provide electrical connection between semiconductor devices packaged in the package structure and an external electronic device such as a printed circuit board (PCB), which is described in further detail below.

In FIG. 1A, the package substrate 104 is a core-less redistribution substrate (but the disclosure is not limited thereto), which includes conductive pads 1041 formed over the release layer 102, a dielectric layer 1042 formed over the release layer 102 and the conductive pads 1041, a wiring layer 1043 formed over the dielectric layer 1042 and in through holes 1042a of the dielectric layer 1042, a dielectric layer 1044 formed over the dielectric layer 1042 and the wiring layer 1043, a wiring layer 1045 formed over the dielectric layer 1044 and in through holes 1044a of the dielectric layer 1044, a dielectric layer 1046 formed over the dielectric layer 1044 and the wiring layer 1045, a wiring layer 1047 formed over the dielectric layer 1046 and in through holes 1046a of the dielectric layer 1046, a dielectric layer 1048 formed over the dielectric layer 1046 and the wiring layer 1047, and conductive pads 1049 formed over the dielectric layer 1048 and in through holes 1048a of the dielectric layer 1048, in accordance with some embodiments.

Each of the wiring layers 1043, 1045, and 1047 includes conductive lines providing electrical connection in horizontal directions and conductive vias providing electrical connection in vertical directions, and the wiring layers 1043, 1045, and 1047 are electrically connected to each other, in accordance with some embodiments. The conductive pads 1041 and 1049 may be exposed at or protruding from the surfaces 104A and 104B of the package substrate 104, respectively, and are electrically connected to the wiring layers 1043, 1045, and 1047, in accordance with some embodiments.

The dielectric layers 1042, 1044, 1046, and 1048 may be made of or include an insulating material such as a polymer material (e.g., polybenzoxazole, polyimide, or a photosensitive material), nitride (e.g., silicon nitride), oxide (e.g., silicon oxide), silicon oxynitride, or the like. The wiring layers 1043, 1045, and 1047 and the conductive pads 1041 and 1049 may be made of or include copper, aluminum, gold, cobalt, titanium, nickel, silver, graphene, one or more other suitable conductive materials, or a combination thereof. The formation of the package substrate 104 (i.e., redistribution substrate) may involve multiple deposition or coating processes, multiple patterning processes, and/or multiple planarization processes. These processes are well known in the art and therefore not described herein.

It should be appreciated that the package substrate 104 shown in FIG. 1A is merely an illustrative example, and many variations and/or modifications can be made to embodiments of the disclosure. For example, the structure, configuration, location, and/or number of the dielectric layers, wiring layers, and/or conductive pads of the package substrate 104 can be changed in different embodiments.

In some other embodiments, the package substrate 104 further includes a core layer (not shown). The core layer may be made of or include a fiber material, a polymer material, a semiconductor material, a glass material, a metal material, or another suitable material. Interconnect structures (for example, composed of dielectric layers, wiring layers, and conductive pads, similar to those previously illustrated in FIG. 1A) can be formed on both sides of the core layer to facilitate routing.

In some embodiments, the package substrate 104 is an interposer substrate which is free from active devices (e.g., transistors and diodes) and passive devices (e.g., resistors, capacitors, inductors, or the like) therein. In some alternative embodiments, the package substrate 104 is a device substrate which includes active and/or passive devices therein.

In accordance with some embodiments, a passivation layer 105 is further formed on the surface 104B of the package substrate 104, as shown in FIG. 1A. The passivation layer 105 (sometimes also called a solder mask) may be configured to protect the underlying metal lines from damage of moisture or other detrimental chemicals. In some embodiments, the passivation layer 105 is formed of or includes inorganic materials such as silicon nitride, silicon oxide, or multi-layers of the organic or inorganic materials. A patterning process is then performed to forming openings 105a (see FIG. 1A) in the passivation layer 105 to partially expose the underlying conductive pads 1049, in accordance with some embodiments. The patterning process may include a photolithography process, an energy beam drilling process (such as a laser beam drilling process, an ion beam drilling process, or an electron beam drilling process), an etching process, a mechanical drilling process, one or more other applicable processes, or a combination thereof. In some other embodiments, the passivation layer 105 can be omitted.

As shown in FIG. 1B, one or more semiconductor dies 106 (for illustration, only one semiconductor die 106 is shown) are stacked over the surface 104B of the package substrate 104 using, for example, a pick-and-place tool (not shown), in accordance with some embodiments. The semiconductor die 106 may be a logic die (e.g., central processing unit, graphics processing unit, field-programmable gate array (FPGA), system-on-chip (SOC) die, microcontroller, or the like), a memory die (e.g., dynamic random access memory (DRAM) die, static random access memory (SRAM) die, or the like), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), or the like. Before being disposed over the package substrate 104, the semiconductor die 106 may be processed according to applicable manufacturing processes to form integrated circuits in the semiconductor die 106. The processes are well known in the art and therefore not described herein.

In some embodiments, the semiconductor die 106 includes a semiconductor substrate (not individually shown), such as silicon, doped or undoped, or an active layer of a semiconductor-on-insulator (SOI) substrate. The semiconductor substrate may also include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, devices (not shown) forming integrated circuits of the semiconductor die 106, such as transistors, diodes, capacitors, resistors, etc., may be formed on or in the semiconductor substrate. A passivation layer (not shown) may be formed over semiconductor substrate to cover the devices.

As shown in FIG. 1B, the semiconductor die 106 also includes conductive pads 1061 exposed at the active surface 106A (e.g., the bottom surface as shown) for external connections, in accordance with some embodiments. The conductive pads 1061 may be embedded in the passivation layer and are electrically connected to the integrated circuits in the semiconductor die 106. In some embodiments, the conductive pads 1061 are made of or include a conductive material, such as metal (e.g., copper, aluminum, nickel, or combinations thereof).

As shown in FIG. 1B, the semiconductor die 106 is bonded to the conductive pads 1049 of the package substrate 104, exposed through the passivation layer 105, for example, through flip-chip bonding by using conductive connectors 107, in accordance with some embodiments. The conductive connectors 107 may include solder balls, micro bumps, or the like, and may be made of or include a solder material. In some embodiments, the solder material may be formed on the exposed conductive pads 1061 of the semiconductor die 106, formed on the exposed conductive pads 1049 of the package substrate 104, or formed on both before bonding, such as using an electroplating process, an electroless plating process, a placement process, a printing process, a physical vapor deposition (PVD) process, a chemical vapor deposition (CVD) process, a photolithography process, one or more other applicable processes, or a combination thereof. A reflow process is then performed to melt the solder material to form the conductive connectors 107, to physically and electrically couple the semiconductor die 106 to the package substrate 104, in accordance with some embodiments.

As shown in FIG. 1B, an underfill element 108 is formed over the surface 104B of package substrate 104 (such as in direct contact with the passivation layer 105) to surround and protect the semiconductor die 106 and the conductive connectors 107 thereunder, and enhances the connection between the semiconductor die 106 and the package substrate 104, in accordance with some embodiments. The underfill element 108 may be made of or include an insulating material such as an underfill material. The underfill material may include an epoxy, a resin, a filler material, a stress release agent (SRA), an adhesion promoter, another suitable material, or a combination thereof. In some embodiments, an underfill material in liquid state is dispensed into the gap between the semiconductor die 106 and the passivation layer 105 to reinforce the strength of the conductive connectors 107 and therefore the overall package structure. After the dispensing, the underfill material is cured (for example by heating or ultraviolet (UV) radiation) to form the underfill element 108, in accordance with some embodiments.

As shown in FIG. 1B, a molding layer 109 is formed over the surface 104B of package substrate 104 (such as in direct contact with the passivation layer 105) to encapsulate and protect the semiconductor die 106 and the underfill element 108, in accordance with some embodiments. The molding layer 109 may be separated from the conductive connectors 107 below the semiconductor die 106 by the underfill element 108. In some embodiments, the molding layer 109 is made of or includes an insulating material such as a molding material. The molding material may include a polymer material, such as an epoxy-based resin with fillers dispersed therein. In some embodiments, a molding material (such as a liquid molding material) is dispensed using, for example, injection molding over the passivation layer 105, the semiconductor die 106, and the underfill element 108. In some other embodiments, the underfill element 108 is omitted, and the molding material may be dispensed into the gap between the semiconductor die 106 and the passivation layer 105 (or the package substrate 104) and in direct contact with the conductive connectors 107 below the semiconductor die 106. A thermal process is then used to cure the liquid molding material and to transform it into the molding layer 109, in accordance with some embodiments.

Figure 2:
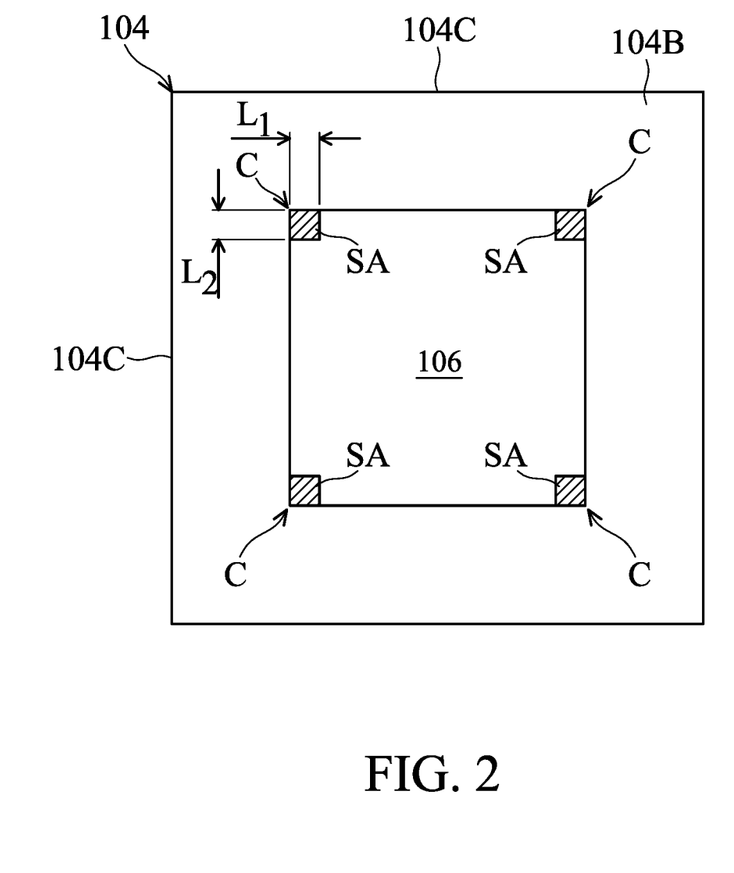
FIG. 2 is a plan view of a semiconductor die package in accordance with some embodiments, wherein the passivation layer, underfill element, and the molding layer over the package substrate are omitted.

Because there is a coefficient of thermal expansion (CTE) mismatch between the package substrate 104 and the devices or other materials thereon, the warpage of the package substrate 104 occurs during the thermal processes as described above. The bending can cause reliability issues, such as crack in conductive lines of the package substrate 104 due to stress. It has been observed that the stress is typically concentrated in the areas between (or corresponding) corners of the semiconductor die 106 and package substrate 104, which causes cracks to easily occur in the conductive lines of the package substrate 104 in these areas. In accordance with some embodiments, as shown in FIG. 2, the stress concentration areas SA (slash areas shown) in the package substrate 104 are close to the corners C of the semiconductor die 106 (therefore, hereinafter may also referred to as the die corner areas) and are under the shadow of the semiconductor die 106 (i.e., within the projection area PA (see FIG. 1B) of the semiconductor die 106). In some embodiments, each stress concentration area SA is square with the length $L_1$, $L_2$ of each side of about 500 μm (i.e., with an area of about 250,000 μm$^2$), but the disclosure is not limited thereto. For example, the shape and size of the stress concentration areas SA can vary in different embodiments, depending on the configuration, shape, size, material, process, etc. for the various components in the package structure.

Figure 3:
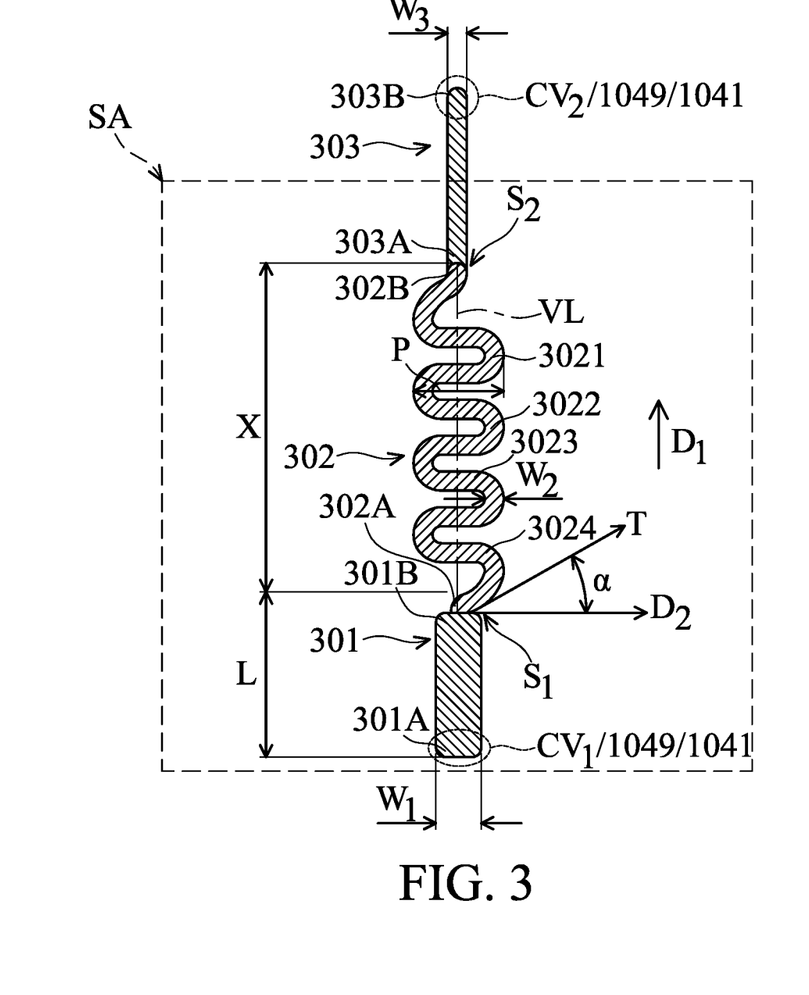
FIG. 3 is a plan view of a conductive line crack prevention design in accordance with some embodiments.
Figure 4:
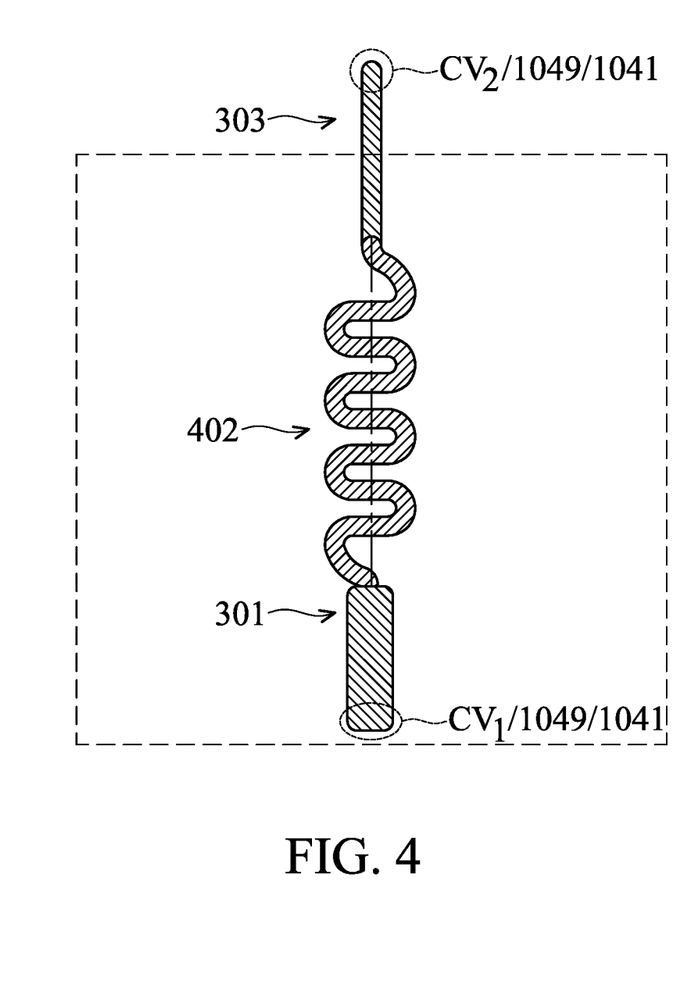
FIG. 4 is a plan view of a conductive line crack prevention design in accordance with some embodiments.
Figure 5:
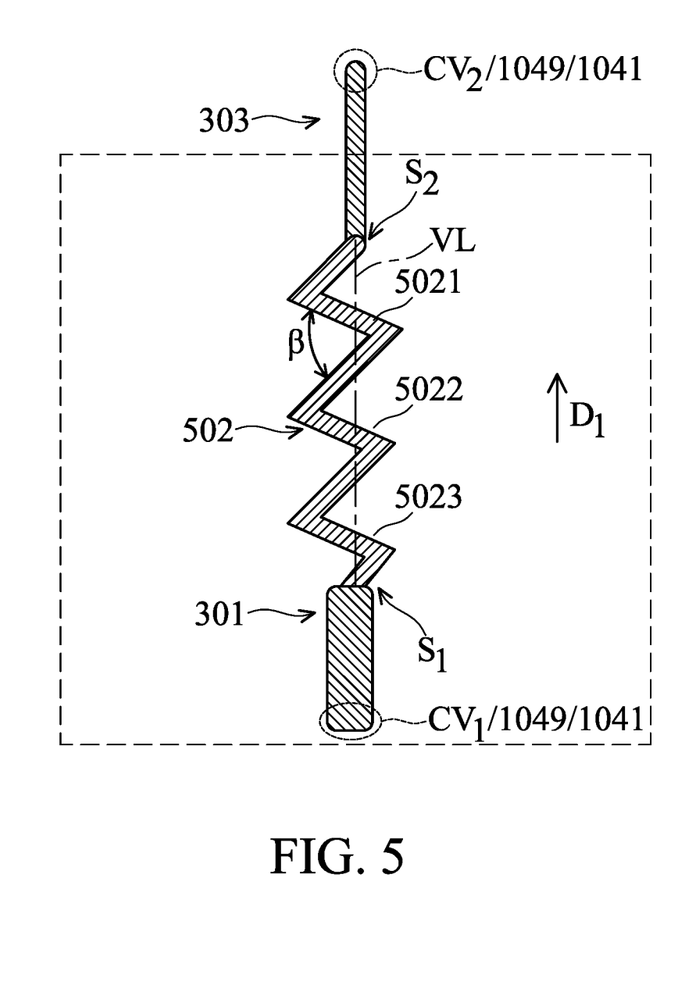
FIG. 5 is a plan view of a conductive line crack prevention design in accordance with some embodiments.

Various embodiments related to conductive line crack prevention design for preventing cracks in conductive lines (particularly the line parts within the stress concentration areas SA) of the package substrate 104 are described in the following. FIGS. 3-5 illustrate plan views of conductive line crack prevention designs in accordance with some embodiments of the disclosure. It should be appreciated that those conductive line crack prevention designs may be applied to one or more wiring layers in the package structure (such as the wiring layers 1043, 1045, and 1047 of the package substrate 104 shown in FIG. 1B) to prevent cracks in the conductive line(s) thereof.

As shown in FIG. 3, the conductive line with crack prevention design includes connected line segments 301 and 302, in accordance with some embodiments. In some embodiments, the line segments 301 and 302 (and their intersection $S_1$) are located in each stress concentration area (die corner area) SA under the shadow of the semiconductor die 106 (see FIG. 2). In some other embodiments, the entire line segment 302 is located in each stress concentration area SA, and a portion of the line segment 301 is outside the stress concentration area SA.

In some embodiments, the line segment 301 is a straight line (i.e., linear) and extends in a first direction $D_1$. The first direction $D_1$ may be a horizontal direction substantially parallel to the surface 104B of the package substrate 104 (see FIG. 1B), and may be parallel to, perpendicular to an outer side 104C (see FIG. 2) of the package substrate 104 or form an angle with the outer side 104C. In some embodiments, the line segment 301 is configured to electrically connect to one of the conductive pads 1049 or 1041 (see FIG. 1B) or electrically connect to an overlying or underlying wiring layer (such as the wiring layer 1043, 1045, or 1047 shown in FIG. 1B) through a conductive via therebetween. For example, as shown in FIG. 3, one end 301A of the line segment 301 may be connected to one conductive pad 1049/1041 or one conductive via $CV_1$ between two adjacent wiring layers of the package structure, and the other end 301B may be connected to the line segment 302.

In some embodiments, the line segment 302 is configured for routing in the package substrate 104. In some embodiments, the line width $W_2$ of the line segment 302 is smaller than the line width $W_1$ of the line segment 301. The ratio of the line width $W_2$ to the line width $W_1$ may be about 1:1.5 to 1:2, but other ratios can also be used. The line segment 302 with a smaller width can save space for arranging more conductive lines (i.e., higher wiring density). It should be appreciated that the stress tends to concentrate at the intersection $S_1$ of the line segment 301 and the line segment 302 with different line widths, so cracks usually occur in the intersection $S_1$. To this end, in accordance with some embodiments, the line segment 302 is routed in a non-linear pattern with a varying extension direction (i.e., different parts of the ling segment 302 extend in various directions) to disperse stress and avoid the stress from being concentrated at the intersection $S_1$, thereby reducing the risk of line cracks.

In some embodiments, one end 302A of the line segment 302 is connected to the end 301B of the line segment 301 to form the intersection $S_1$, and the other end 302B is away from the line segment 301. In some embodiments, the line segment 302 has a zig-zag (serpentine) pattern and consists of several S-shaped lines. For example, in the embodiments of FIG. 3, the line segment 302 consists of four connected S-shaped lines 3021, 3022, 3023, and 3024. The S-shaped line 3024 is closest to the intersection $S_1$, the S-shaped line 3021 is farthest from the intersection $S_1$, and the S-shaped lines 3022 and 3023 are between the S-shaped lines 3021 and 3024. One of ordinary skill in the art will appreciate that other numbers (for example, one, two, three or more than four, etc.) of the S-shaped lines can also be used.

In some embodiments, as shown in FIG. 3, both ends 302A and 302B of the line segment 302 are located on a virtual straight line VL (it can also be regarded as a virtual connecting line of the ends 302A and 302B). The virtual straight line VL is aligned with the line segment 301 in the first direction $D_1$. In this case, each S-shaped line of the line segment 302 can be composed of two connecting U-shaped curves (bending parts) that are on both sides of the virtual straight line VL. The two U-shaped curves of each S-shaped line may have the same shape/size or different shapes/sizes. For example, in FIG. 3, the two U-shaped curves of the S-shaped lines 3022 and 3023 are symmetrical U-shaped and have the same size, and the two U-shaped curves of the S-shaped lines 3021 and 3024 include a symmetrical U-shaped curve and an asymmetrical U-shaped curve, with different sizes (for example, the width (end-to-end distance) of the asymmetrical U-shaped curve (of S-shaped line 3021 or 3024) adjacent to the intersection $S_1$ or $S_2$ in the first direction $D_1$ is greater than the width of the symmetrical U-shaped curve (of S-shaped line 3021 or 3024) adjacent to the S-shaped line 3022 or 3023 in the first direction $D_1$). That is to say, the shape of the S-shaped line 3021 is different from the S-shaped lines 3022, 3023 and 3024, and the shape of the S-shaped line 3024 is different from the S-shaped lines 3021, 3022 and 3023. In some other embodiments, the virtual straight line VL may also form an angle greater than 0 degrees with the first direction $D_1$.

As shown in FIG. 3, an angle $\alpha$ is formed between a tangent direction T of a part of the line segment 302 (i.e., the S-shaped line 3024) that intersects the line segment 301 and a second direction $D_2$ perpendicular to the first direction $D_1$. In accordance with some embodiments, the formed angle $\alpha$ is greater than 0 degrees and equal to or less than 60 degrees (i.e., $0°<\alpha\leq60°$), so that the line segment 302 can effectively disperse stress and avoid stress concentration at the intersection $S_1$. If the angle $\alpha$ is equal to 0 degrees, a right angle is formed between the line segment 301 and the line segment 302, where the stress can be easily concentrated to cause cracks. If the angle $\alpha$ is greater than 60 degrees, the pattern of the line segment 302 is close to a straight line, thus losing the ability to disperse stress.

In some embodiments, as shown in FIG. 3, the maximum size P (i.e., the distance between the leftmost and rightmost ends shown in the figure) of the line segment 302 in the second direction $D_2$ is greater than the line width $W_1$ of the line segment 301 in the second direction $D_2$. In some embodiments, in order to reduce the occupied space, the maximum size P of the line segment 302 does not exceed twice the line width $W_1$ of the line segment 301. In addition, the distance X (see FIG. 3) between the ends 302A and 302B of the line segment 302 is equal to or less than about 100 μm to save space, in accordance with some embodiments. The length of the line segment 302 in the first direction $D_1$ (i.e., the distance X) may generally be greater than the length L of the line segment 301 in the first direction $D_1$, but the disclosure is not limited thereto.

Figure 3A:
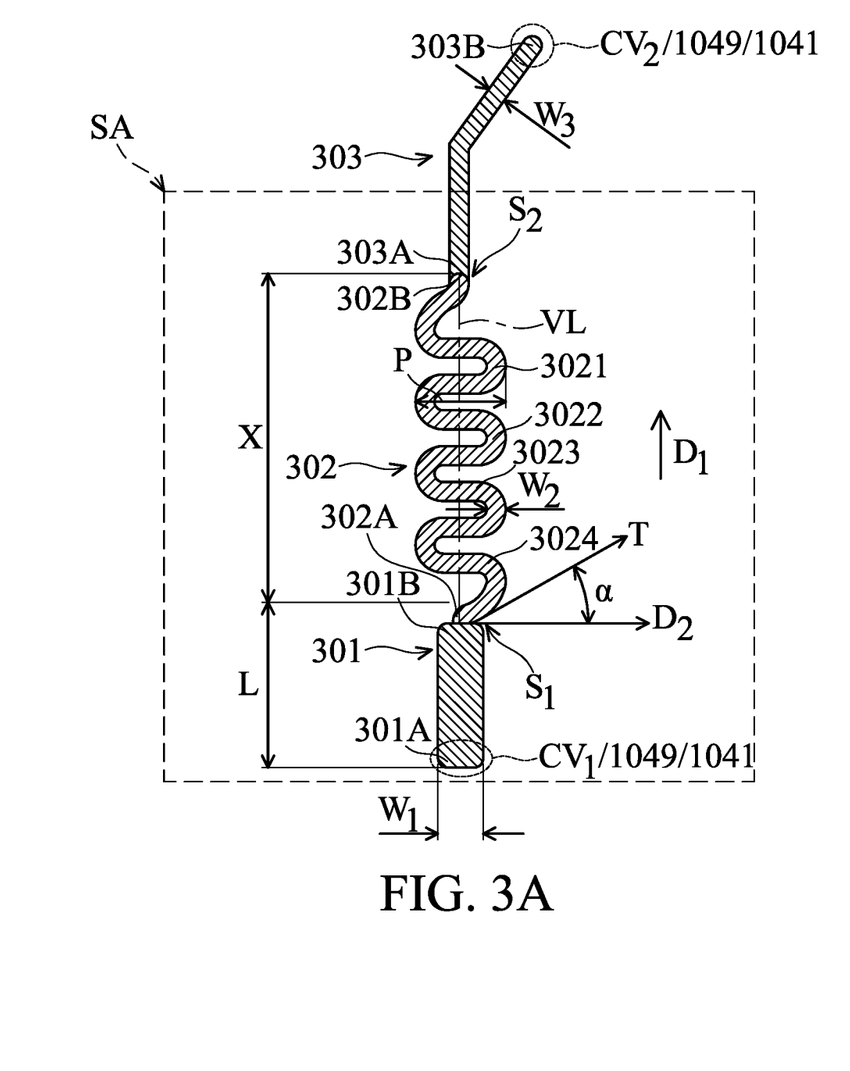
FIG. 3A is a plan view of a conductive line crack prevention design in accordance with some embodiments.

As shown in FIG. 3, the line segment 302 is further connected to a line segment 303 and is interposed between the line segment 301 and the line segment 303, in accordance with some embodiments. The line segment 303 may be configured for routing in the package substrate 104, similar to the line segment 302. In some embodiments, the line width $W_3$ of the line segment 303 is substantially equal to the line width $W_2$ of the line segment 302 and smaller than the line width $W_1$ of the line segment 301, so as to save space. In some embodiments shown in FIG. 3, the line segment 303 is a straight line (i.e., linear) and extends in the first direction $D_1$. In some other embodiments, the linear line segment 303 extends in a direction different from the first direction $D_1$ (i.e., an angle greater than 0 degrees is formed between the linear line segment 303 and the first direction $D_1$). In some alternative embodiments shown in FIG. 3A, the line segment 303 is non-linear and has at least one bend.

In some embodiments, one end 303A of the line segment 303 is connected to the end 302B of the line segment 302 to form an intersection S 2 (which may be located in the stress concentration area SA), and the other end 303B is away from the line segment 302. The end 303B of the line segment 303 may be configured to electrically connect to one of the conductive pads 1049 or 1041 (see also FIG. 1B) or electrically connect to an overlying or underlying wiring layer (such as the wiring layer 1043, 1045, or 1047 shown in FIG. 1B) through a conductive via CV 2 therebetween.

Many variations and/or modifications can be made to embodiments of the disclosure. For example, the shape or pattern of the narrower line segment 302 connecting the wider line segment 301 can vary in different embodiments.

FIG. 4 illustrates a plan view of a conductive line crack prevention design in accordance with some alternative embodiments, wherein the line segment 402 (interposed between the line segments 301 and 303) in FIG. 4 has a mirror pattern of the line segment 302 of the embodiments in FIG. 3. Other structures in FIG. 4 are the same as those in FIG. 3.

FIG. 5 illustrates a plan view of a conductive line crack prevention design in accordance with some other embodiments. The most of the structures in FIG. 5 are the same as those in FIG. 3, so only the different parts are described here. In FIG. 5, the narrower line segment 502 connecting the wider line segment 301 has a zig-zag pattern and consists of several lightning-shaped lines (such as three lightning-shaped lines 5021, 5022, and 5023, but other numbers can also be used). Each of the lightning-shaped lines 5021, 5022, and 5023 is composed of multiple straight lines extending in different directions than the first direction $D_1$. An angle β of about 30 degrees to about 60 degrees may be formed at the intersection of two connected lines in some cases, but other degrees can also be used. Alternatively, each of the lightning-shaped lines 5021, 5022, and 5023 can be composed of two triangular bending parts that are on both sides of the virtual straight line VL, as shown in FIG. 5. With the above design, it can also help disperse stress and avoid stress concentration at the intersection of line segments with different line widths, thereby reducing the risk of line cracks.

Figure 6:
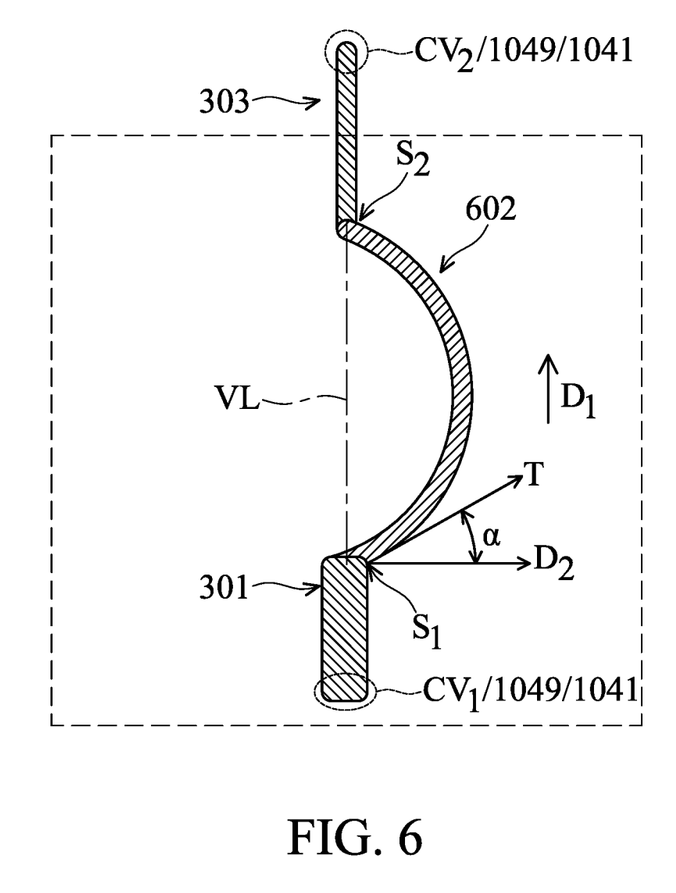
FIG. 6 is a plan view of a conductive line crack prevention design in accordance with some embodiments.

FIG. 6 illustrates a plan view of a conductive line crack prevention design in accordance with some other embodiments. The most of the structures in FIG. 6 are the same as those in FIG. 3, so only the different parts are described here. In FIG. 6, the narrower line segment 602 connecting the wider line segment 301 is routed in a curved pattern. In accordance with some embodiments, the curved pattern is a parabolic pattern. In this case, the line segment 602 has one bending part on one side of the virtual straight line VL, as shown in FIG. 6. However, other applicable curved patterns can also be used. For example, the curved pattern may include multiple bending parts on one side or both sides of the virtual straight line VL, in some other embodiments. As shown in FIG. 6, an angle α is formed between a tangent direction T of a part of the line segment 602 that intersects the line segment 301 and the second direction $D_2$. In accordance with some embodiments, the formed angle α is greater than 0 degrees and equal to or less than 60 degrees (i.e., $0°<α≤60°$), so that the line segment 602 can effectively disperse stress and avoid stress concentration at the intersection $S_1$ (similar to the line segment 302 illustrated in FIG. 3).

One of ordinary skill in the art will appreciate that the above conductive line crack prevention design examples are provided for illustrative purposes, and other designs utilizing different routing patterns (as long as they can be formed using the processes described above or any other known techniques) that can avoid stress concentration at the intersection of line segments with different line widths may also be used.

Referring back to FIG. 1B, after forming the molding layer 109, a planarization process is further performed to partially remove the molding layer 109, in accordance with some embodiments. As a result, a thickness of the molding layer 109 in a vertical direction perpendicular to the surface 104B is reduced, and the overall package structure is thinner.

In some embodiments, the top surface 106B of the semiconductor die 106 is exposed from the molding layer 109 (for example, the top surface 106B is substantially flush with the top surface 109A of the molding layer 109) after the planarization process, as shown in FIG. 1B. This facilitates the dissipation of heat generated from the semiconductor die 106 during operation. In some other embodiments, the semiconductor die 106 is still buried in (i.e., the top surface 106B being covered by a portion of the molding layer 109) the molding layer 109 after the planarization process. The planarization process may include a grinding process, a chemical mechanical polishing (CMP) process, an etching process, a dry polishing process, one or more other applicable processes, or a combination thereof.

As shown in FIG. 1C, the carrier substrate 100 and the release layer 102 are removed to expose the surface 104A of the package substrate 104, in accordance with some embodiments. Afterwards, conductive bumps 110 are formed over the surface 104A that is originally covered by the carrier substrate 100, in accordance with some embodiments. Each of the conductive bumps 110 may be electrically connected to one of the conductive pads 1041 exposed at the surface 104A. In some embodiments, the conductive bumps 110 are or include solder bumps such as tin-containing solder bumps. The tin-containing solder bumps may further include copper, silver, gold, aluminum, lead, one or more other suitable materials, or a combination thereof. In some embodiments, the tin-containing solder bump is lead-free.

In some embodiments, solder balls (or solder elements) are disposed on the exposed conductive pads 1041 after the removal of the carrier substrate 100. A reflow process is then carried out to melt the solder balls into the conductive bumps 110. In some other embodiments, under bump metallization (UBM) elements are formed over the exposed conductive pads 1041 before the solder balls are disposed. In some other embodiments, solder elements are electroplated onto the exposed conductive pads 1041. Afterwards, a reflow process is used to melt the solder element to form the conductive bumps 110. The conductive bumps 110 (sometimes also called ball grid array (BGA)) allow the semiconductor die package structure to be bonded and electrically connected to an external PCB or other electronic devices (not shown), in accordance with some embodiments.

As a result, the process for forming the resulting semiconductor die package structure illustrated in FIG. 1C is completed. It should be appreciated that the above method examples are provided for illustrative purposes, and other methods that can form the resulting package structure of FIG. 1C can also be used.

Although the above package structure includes only one semiconductor die, two or more semiconductor dies of the same or different types can also be packaged in the package structure, and the above conductive line crack prevention designs can be used to prevent the conductive lines of the package substrate under the semiconductor dies at the predetermined stress concentration areas (die corner areas) from cracking after thermal processes. Additionally or alternatively, the package structure may also include a package module including an interposer substrate and one or more semiconductor dies mounted thereon, in some other embodiments. The package module is bonded to the package substrate by, for example, flip-chip bonding. The above conductive line crack prevention designs can also be used to prevent the conductive lines of the package substrate under the package module at the predetermined stress concentration areas from cracking after thermal processes. Furthermore, in accordance with some other embodiments, the linear line segment (such as the line segment 301) and the non-linear or curved line segment (such as the line segment 302, 402, or 502) of the above conductive line crack prevention designs have the same line width.

Embodiments of the disclosure form a semiconductor die package including a package substrate and a semiconductor die disposed over the package substrate. In accordance with some embodiments, the conductive lines of at least one wiring layer of the package substrate at the predetermined die corner areas (stress concentration areas) under the die shadow are routed in a non-linear or curved pattern to disperse stress and avoid stress concentration at the intersection of line segments with different line widths, thereby reducing the risk of line crack after thermal processes. Accordingly, the reliability of the semiconductor die package is improved.

In accordance with some embodiments, a semiconductor die package is provided. The semiconductor die package includes a semiconductor die and a package substrate supporting and electrically connected to the semiconductor die. The semiconductor die has a corner. The package substrate includes several conductive lines, and one of the conductive lines under the corner of the semiconductor die includes a first line segment and a second line segment connected to the first line segment. The first line segment is linear and extends in a first direction. The second line segment is non-linear and has a varying extension direction.

In accordance with some embodiments, a semiconductor die package is provided. The semiconductor die package includes a semiconductor die and a package substrate supporting and electrically connected to the semiconductor die. The semiconductor die has a corner. The package substrate includes several conductive lines, and one of the conductive lines under the corner of the semiconductor die includes a first line segment and a second line segment connected to the first line segment. The first line segment is linear. The second line segment is non-linear and has at least one bending part.

In accordance with some embodiments, a semiconductor die package is provided. The semiconductor die package includes a semiconductor die and a package substrate disposed below the semiconductor die. The semiconductor die has a corner. The package substrate includes several conductive lines, and one of the conductive lines under the corner of the semiconductor die includes a first line segment, a second line segment, and a third line segment. The second line segment is interposed between the first line segment and the third line segment. The first line segment is linear. The second line segment is non-linear and has at least one bending part.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die package, comprising:
a semiconductor die having a corner; and
a package substrate supporting and electrically connected to the semiconductor die, wherein the package substrate comprises a plurality of conductive lines, and one of the conductive lines under the corner comprises:
a first line segment; and
a second line segment connected to the first line segment, wherein the first line segment is linear and extends in a first direction, and the second line segment is non-linear and has a varying extension direction.

2. The semiconductor die package as claimed in claim 1, wherein the second line segment is located in a die corner area which is within a projection area of the semiconductor die and close to the corner.

3. The semiconductor die package as claimed in claim 1, wherein a line width of the second line segment is smaller than a line width of the first line segment.

4. The semiconductor die package as claimed in claim 1, wherein an angle formed between a tangent direction of a part of the second line segment that intersects the first line segment and a second direction perpendicular to the first direction is greater than 0 degrees and equal to or less than 60 degrees.

5. The semiconductor die package as claimed in claim 1, wherein a distance between a leftmost end of the second line segment and a rightmost end of the second line segment in a second direction is greater than a line width of the first segment in the second direction, the second direction being perpendicular to the first direction.

6. The semiconductor die package as claimed in claim 1, wherein the second line segment has a parabolic pattern.

7. The semiconductor die package as claimed in claim 1, wherein the second line segment has a zig-zag pattern.

8. The semiconductor die package as claimed in claim 1, wherein the second line segment has a first end connected to the first line segment and a second end away from the first line segment, and the first end and the second end are located on a virtual straight line aligned with the first line segment in the first direction.

9. Semiconductor die package as claimed in claim 1, wherein the package substrate further comprises a plurality of conductive pads through which the semiconductor die is bonded to the package substrate, wherein the first line segment has a first end connected to one of the conductive pads and a second end connected to the second line segment.

10. The semiconductor die package as claimed in claim 1, wherein the package substrate further includes a plurality of conductive vias electrically connected to some of the conductive lines stacked in a vertical direction perpendicular to the first direction, wherein the first line segment has a first end connected to one of the conductive vias and a second end connected to the second line segment.

11. A semiconductor die package, comprising:
a semiconductor die having a corner; and
a package substrate supporting and electrically connected to the semiconductor die, wherein the package substrate comprises a plurality of conductive lines, and one of the conductive lines under the corner comprises:
a first line segment; and
a second line segment connected to the first line segment, wherein the first line segment is linear, and the second line segment is non-linear and has at least one bending part.

12. The semiconductor die package as claimed in claim 11, wherein the second line segment is located in a die corner area which is within a projection area of the semiconductor die and close to the corner.

13. The semiconductor die package as claimed in claim 11, wherein the second line segment has a first end connected to the first line segment and a second end away from the first line segment, and the first end and the second end are located on a virtual straight line, wherein the at least one bending part of the second line segment is located on at least one side of the virtual straight line.

14. The semiconductor die package as claimed in claim 13, wherein the second line segment has a parabolic pattern and has one bending part on one side of the virtual straight line.

15. The semiconductor die package as claimed in claim 13, wherein the second line segment has a zig-zag pattern and has bending parts on both sides of the virtual straight line.

16. A semiconductor die package, comprising:
a semiconductor die having a corner; and
a package substrate below the semiconductor die and comprising a plurality of conductive lines, wherein one of the conductive lines under the corner comprises:
a first line segment;
a second line segment; and
a third line segment, wherein the second line segment is interposed between the first line segment and the third line segment, and is located in a die corner area which is within a projection area of the semiconductor die and close to the corner, and wherein the first line segment is linear, and the second line segment is non-linear and has at least one bending part, wherein the first line segment extends in a first direction, and wherein an angle formed between a tangent direction of a part of the second line segment that intersects the first line segment and a second direction perpendicular to the first direction is greater than 0 degrees and equal to or less than 60 degrees.

17. The semiconductor die package as claimed in claim 16, wherein the third line segment is linear and extends in the first direction.

18. Semiconductor die package as claimed in claim 16, wherein the third line segment is non-linear and has at least one bending part.

19. The semiconductor die package as claimed in claim 16, wherein the second line segment has a zig-zag pattern.

20. The semiconductor die package as claimed in claim 16, wherein a line width of the second line segment is smaller than a line width of the first line segment.

* * * * *